(12) United States Patent
Morrow et al.

(10) Patent No.: US 7,617,988 B2
(45) Date of Patent: *Nov. 17, 2009

(54) INTRUSION BARRIER AND THERMAL INSULATOR FOR THERMOSTAT

(75) Inventors: Benjamin V. Morrow, Pennellville, NY (US); Ronald B. Kadah, Fayetteville, NY (US)

(73) Assignee: International Controls and Measurement Corp., North Syracuse, NY (US)

( * ) Notice: Subject to any disclaimer, the term of this patent is extended or adjusted under 35 U.S.C. 154(b) by 776 days.

This patent is subject to a terminal disclaimer.

(21) Appl. No.: 10/887,675

(22) Filed: Jul. 9, 2004

(65) Prior Publication Data

US 2006/0006244 A1    Jan. 12, 2006

(51) Int. Cl.
*H05B 1/02* (2006.01)
*H02G 3/14* (2006.01)

(52) U.S. Cl. .............. 236/99 D; 236/DIG. 19; 174/67

(58) Field of Classification Search .......... 337/380, 337/381; 236/78, 1, 1 R, 78 R, 99 D, DIG. 19
See application file for complete search history.

(56) References Cited

U.S. PATENT DOCUMENTS

| 4,235,368 | A | * | 11/1980 | Neel | 236/94 |
|---|---|---|---|---|---|
| 4,293,173 | A | * | 10/1981 | Tricca | 439/148 |
| 4,347,443 | A | * | 8/1982 | Whitney | 307/117 |
| 4,659,236 | A | * | 4/1987 | Hobbs | 374/208 |
| 5,284,204 | A | * | 2/1994 | Morgan | 165/219 |
| 6,206,295 | B1 | * | 3/2001 | LaCoste | 236/94 |
| 6,293,700 | B1 | * | 9/2001 | Lund et al. | 374/181 |
| 6,347,747 | B1 | * | 2/2002 | Nesbitt | 236/78 D |
| 6,597,275 | B2 | * | 7/2003 | Morrow et al. | 337/381 |
| 2003/0085291 | A1 | * | 5/2003 | Morrow et al. | 236/46 R |

OTHER PUBLICATIONS

Honeywell, TP972A Pneumatic Thermostat, 1985.*
Honeywell, T822C,E Cooling Thermostats, 1993.*

* cited by examiner

*Primary Examiner*—Chen-Wen Jiang
(74) *Attorney, Agent, or Firm*—Bernhard P. Molldrem, Jr.

(57) ABSTRACT

A wall plate for a wall thermostat blocks intrusion air from the thermostat. The wall plate has a wire passage aligned with the wall penetration through which the thermostat wires emerge. The wall plate member directs any intrusion air that flows out the penetration away from the cavity of said thermostat. An insulating layer, e.g., a closed-cell foam sheet, in the wall plate insulates the thermostat from direct thermal contact with the wall. The closed-cell material closes around the thermostat wires. Bosses or feet on the thermostat back plate create a standoff between the wall plate and the thermostat.

15 Claims, 4 Drawing Sheets

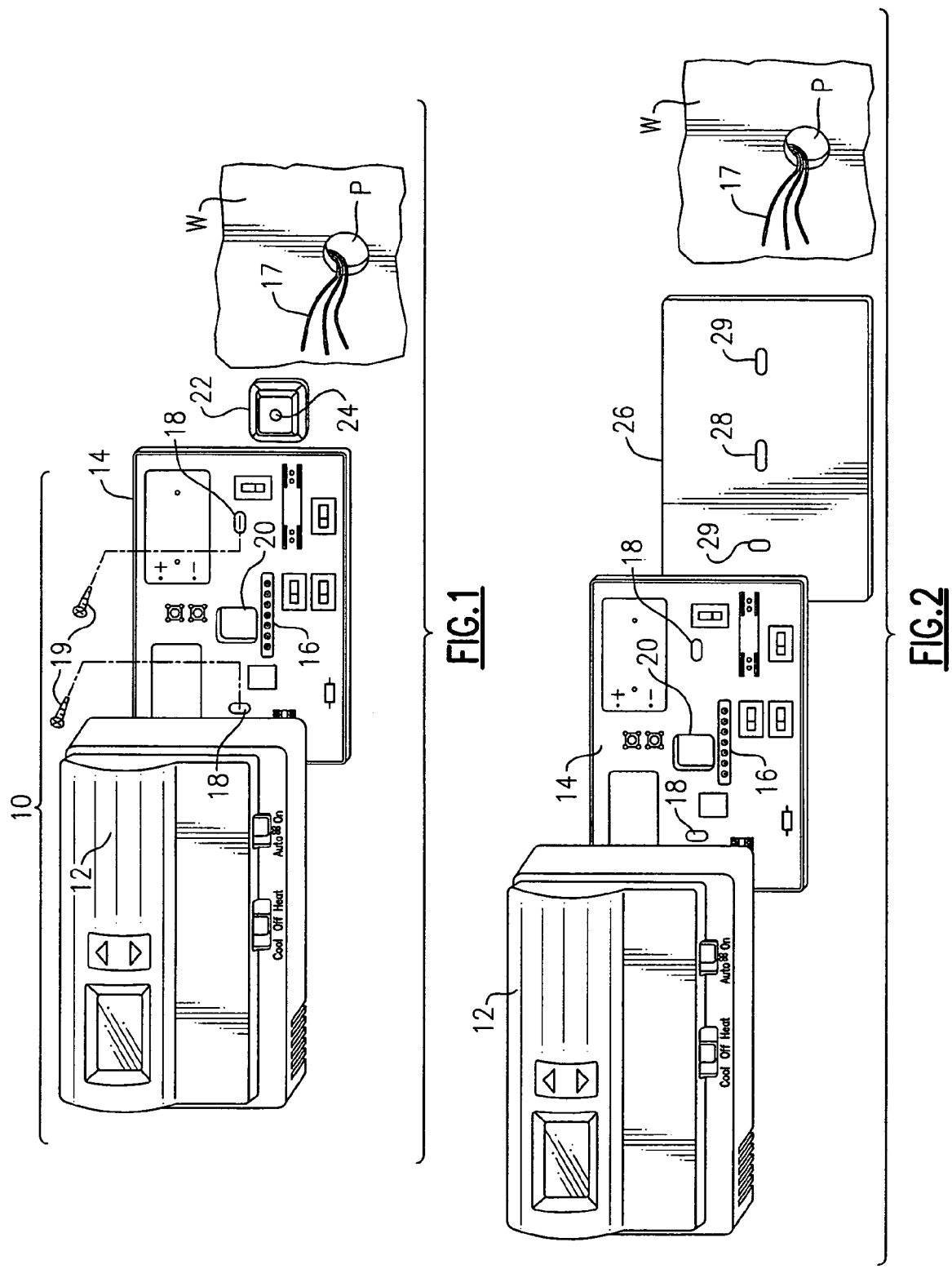

INTRUSION BARRIER AND THERMAL INSULATOR FOR THERMOSTAT

BACKGROUND OF THE INVENTION

This invention relates to control devices for controlling the temperature, humidity, and/or other environmental conditions in an interior comfort space, and is more particularly concerned with an improvement to a wall thermostat to prevent inaccuracies and misoperation that may result from intrusion air which may enter the thermostat from a hollow wall on which the thermostat is mounted.

Wall thermostats are typically installed on an interior wall of a house or other building to control the operation of a furnace, air conditioner, heat pump, or other environmental control equipment. The thermostat is intended to monitor the temperature of the room or other interior comfort space continuously, and to adjust the operation of the associated environmental control equipment to keep the interior comfort space parameter (e.g., temperature) within some range (e.g., 68° F., ±1.0° F.). Other controls may be sensitive to other parameters, such as humidity or particulate level. The thermostat is connected to the furnace, air conditioner, heat pump or the like by means of a run of thermostat wires, which pass from the furnace control board up through spaces in the interior walls, and emerge at an opening in one of the walls, and this is the place the thermostat is to be mounted. An opening is provided in the back of the thermostat for the wires to pass through, so that the wires can be connected to appropriate contacts inside the thermostat housing.

In practice, the opening or penetration in the wall for the thermostat wires allows some intrusion air to enter the room, and this air passes out of the wall cavity, through the thermostat opening, into the interior of the thermostat housing. As a result, the sensors inside the housing are influenced to a significant degree by intrusion air that comes through the hollow wall, and this air can be warmer or cooler than the rest of the air in the room. Even if a contractor plasters or caulks the wire opening during construction of the house, the plaster or caulk can eventually dry and crack, and permit intrusion air to enter the thermostat. As a result, the actual room air temperature (or humidity) can be outside the range set on the thermostat (or humidistat), and this can occur without any malfunction of either the thermostat or the environmental control equipment.

In addition, accurate control over room temperature is made difficult when the thermostat housing is in direct contact with the wall, which may be significantly warmer or cooler than the room air. That is, if the thermostat is in direct thermal contact with the wall, and if the wall is warmer or cooler than the air in the room, the accuracy of the thermostat can be impaired, even in the absence of intrusion air from the wall cavity. However, no one to date has considered thermally isolating the thermostat from the surface of the wall.

OBJECTS AND SUMMARY OF THE INVENTION

Accordingly, it is an object of the present invention to provide an improvement to a wall thermostat that overcomes the above-mentioned drawback(s) of the prior art.

It is another object to provide an effective solution to the above-mentioned problem, which solution is of a straightforward, one-piece design, and which is simple to install.

It is a more specific object to provide a barrier that diverts or blocks intrusion air from entering the thermostat or other similar control device.

It is yet another object to interpose a thermal barrier between the wall and the thermostat to avoid direct thermal contact between the wall and the thermostat.

In accordance with one aspect of the present invention, a thermostat arrangement that is adapted for mounting on a wall of a controlled space includes a thermostat having a front cover and a back plate adapted to be mounted on the interior wall. The back plate and the cover define a cavity, and the temperature sensor and other control circuitry are contained within this cavity. The circuitry includes contacts which are adapted to receive two or more thermostat wires that protrude through a penetration in the wall. The back plate has mounting screw openings for mounting the thermostat on the wall over the penetration, and also has a thermostat wire opening adapted to receive the two or more thermostat wires. As a means for blocking or redirecting intrusion air flow that may come out of the wall penetration and to avoid having the intrusion air enter the interior cavity of the thermostat, a wall plate member may serve as a barrier to block intrusion air from the thermostat. In this case, the wall plate member is adapted to be installed between the wall and the back plate of the thermostat. The wall plate has a wire passage that is to be aligned with the wall penetration and through which said thermostat wires are passed. The passage closes over the thermostat wires. The wall plate member serves as a barrier to direct intrusion air that flows out the penetration away from the cavity of said thermostat. In addition, an insulating layer, e.g., a closed-cell foam sheet, is included as part of the wall plate, which serves as a thermal barrier so that the body of the thermostat is insulated from direct thermal contact with the wall on which it is mounted. The closed-cell material is of a type that will close around the thermostat wires that pass through it, so as to block any air flow. There can be small bosses or feet on either the wall plate or the thermostat back plate so that there is also a small standoff between the wall plate and the back plate of the thermostat.

Alternatively, a resilient plug is fitted into said thermostat wire opening in the back plate. This plug may be a grommet of cross section to match that of the opening, and may be formed of a soft, resilient material, i.e., a rubbery material. The plug has a passage through which the thermostat wires are passed, with this passage closing over the thermostat wires. The resilient plug can be used in addition to the insulated wall plate mentioned above.

In either case, any intrusion air ends up being mixed in with the room air, and does not pass directly into the thermostat, and the thermostat is held out of direct thermal contact with the wall itself, which may not necessarily be at the same temperature as the room air. The thermostat then senses the room air parameters, e.g., temperature or humidity, much more accurately, and permits the furnace, air conditioner, heat pump, or other environmental control equipment to keep the interior room air within the comfort range that is set on the device.

The above and many other objects, features, and advantages of this invention will be more fully appreciated from the ensuing description of certain preferred embodiments, which are to be read in conjunction with the accompanying Drawing.

BRIEF DESCRIPTION OF THE DRAWING

FIG. 1 is an exploded assembly view of a thermostat with a thermostat wire grommet.

FIG. 2 is an exploded assembly view of a thermostat with a wall plate.

DETAILED DESCRIPTION OF THE PREFERRED EMBODIMENT

Figure 3:
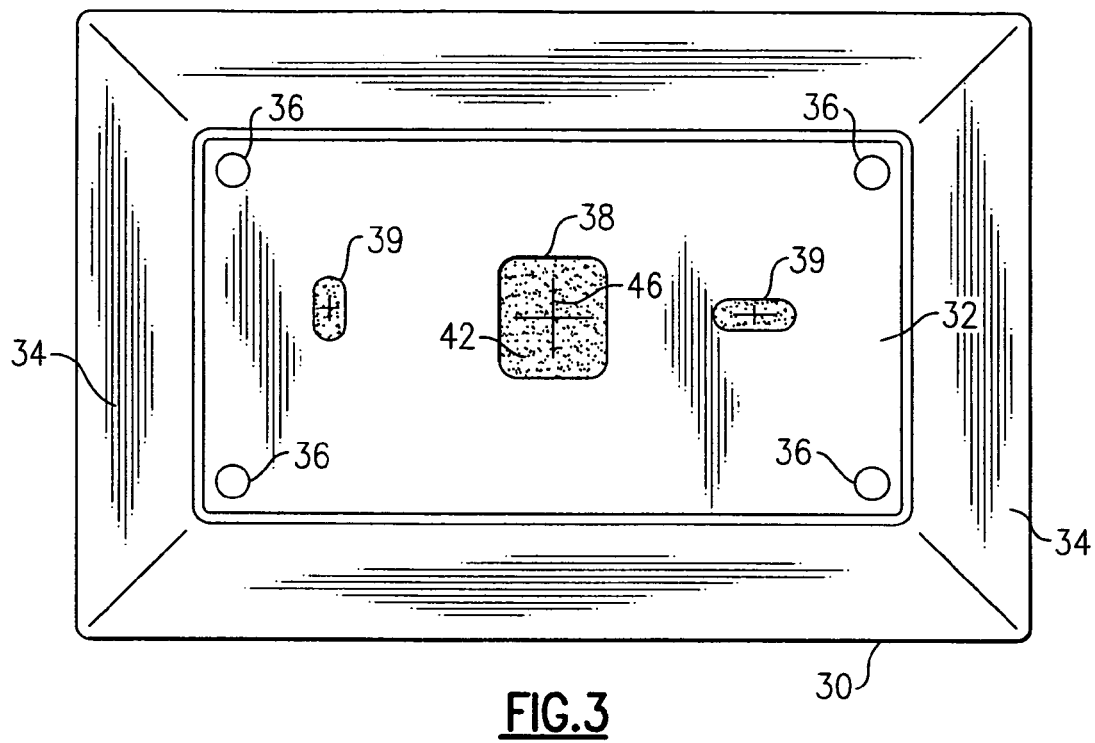
FIG. 3 is a front plan view of a thermally insulated thermostat wall plate according to an embodiment of this invention.

With reference now to the Drawing, FIG. 1 shows a wall thermostat assembly 10 that is to be mounted onto a wall W of a room of a dwelling, commercial building, or other structure where a human comfort space is to be maintained within some desired range of temperature. Here the thermostat 10 comprises a front cover 12 which fits onto a back plate 14. There are sensors, switches, and electrical and electronic components mounted on the back plate 14, which elements are of any well known configuration, and are not shown in detail and not discussed here, except that a contact strip 16 is present for connecting some number of thermostat wires 17, here shown protruding out a hole or penetration P in the wall W. In this thermostat 10, there are screw holes 18 provided at the left and right sides of the back plate 14, and a pair of threaded fasteners 19 that mount the back plate 14 onto the wall W. The back plate is positioned on the wall so that a thermostat wire opening 20, which is at or near the center of the back plate 14, is aligned over the wall penetration P.

A grommet or plug 22 is formed of rubber, or of another generally soft, resilient material, and is dimensioned to fit snugly into the wire opening 20 in the back plate 14. There is an opening 24 in the center part of the grommet 22, and the thermostat wires are passed through this opening 24. When the grommet 22 is then pushed into the opening 20, the rubbery material is squeezed against the thermostat wires, closing off the opening. Then, the back plate is installed onto the wall W, using the screws or other fasteners 19. The grommet 22 blocks the opening 20, so that the path of least resistance for any intrusion air from the penetration P is around the grommet, and into the room space, where the intrusion air mixes with the rest of the room air and does not directly affect the action of the thermostat.

As shown in FIG. 2, the thermostat 10 is again shown in an alternative embodiment, in which a wall plate 26 is disposed between the wall W and the back plate 14 of the thermostat. Here, the elements of the thermostat 10, wires 17, and wall W are identified with the same reference numbers as in FIG. 1, and do not need to be discussed in great detail.

In FIG. 2, prior to installation of the back plate 14 onto the wall W, the thermostat wires 17 are threaded through a small central wire opening 28 in the wall plate. Then the wires are passed through the opening 20 of the back plate, and the latter is installed onto the wall W using the threaded fasteners 19. Slots 29 or similar passages for the fasteners 19 are provided on the left and right sides of the wall plate 26. Then, the wires 17 are attached to the appropriate contacts in the strip 16, and the cover 12 is snapped in place on the back plate 14.

In the FIG. 2 arrangement, the wall plate can be made, either entirely or partially, of a resilient material, so that the opening 28 closes snugly over the wires 17, and blocks any flow of intrusion air from entering the interior space of the thermostat 10. Alternatively, the wall plate 26 can be made of a more rigid material, with a central insert of a resilient material, and with the opening 28 being in this insert.

It is entirely possible to employ both the wall plate 26 of FIG. 2 and the plug or grommet 22 of FIG. 1 in the same thermostat, although each alternative can function independently. While not specifically shown here, there may be slots or channels provided in the wall-facing side of the wall plate 26, so that intrusion air has a pathway into the general room air space. However, the small irregularities and texture of the wall W will generally provide sufficient clearance for this diversion air flow.

Here, the thermostat 10 is of generally rectangular shape, but the concepts of this invention will perform equally well with thermostats of other shapes and designs. The same is true for the shape of the opening 20, and grommets 22 can be made to suit thermostat wire openings of other shapes and dimensions. A slot may be provided in some embodiments in place of the wire opening 24 shown for this embodiment. While the above design is preferred, an alternative design for either a grommet or a wall plate could comprise two or more sections.

Figure 6:
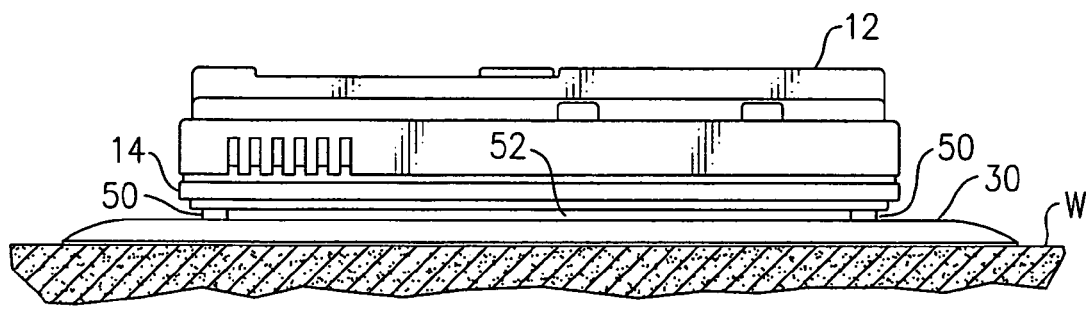
FIG. 6 is a bottom view of the thermostat and wall plate of FIG. 5.
Figure 4:
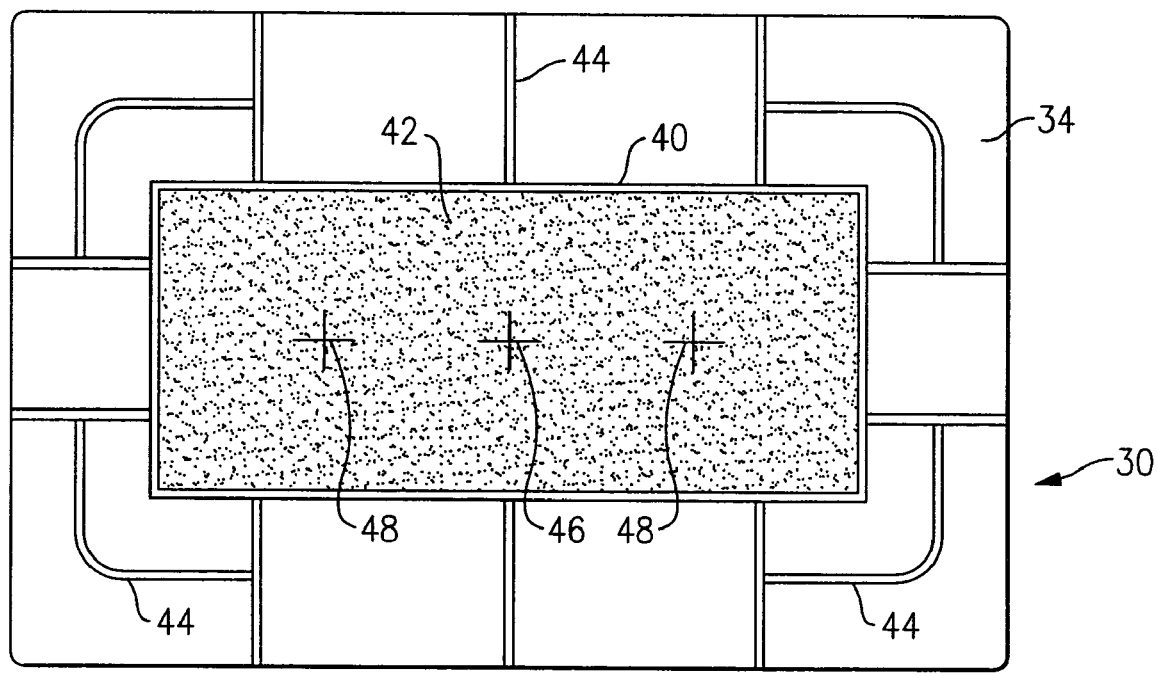
FIG. 4 is a plan view of the back of the wall plate of this embodiment.
Figure 5:
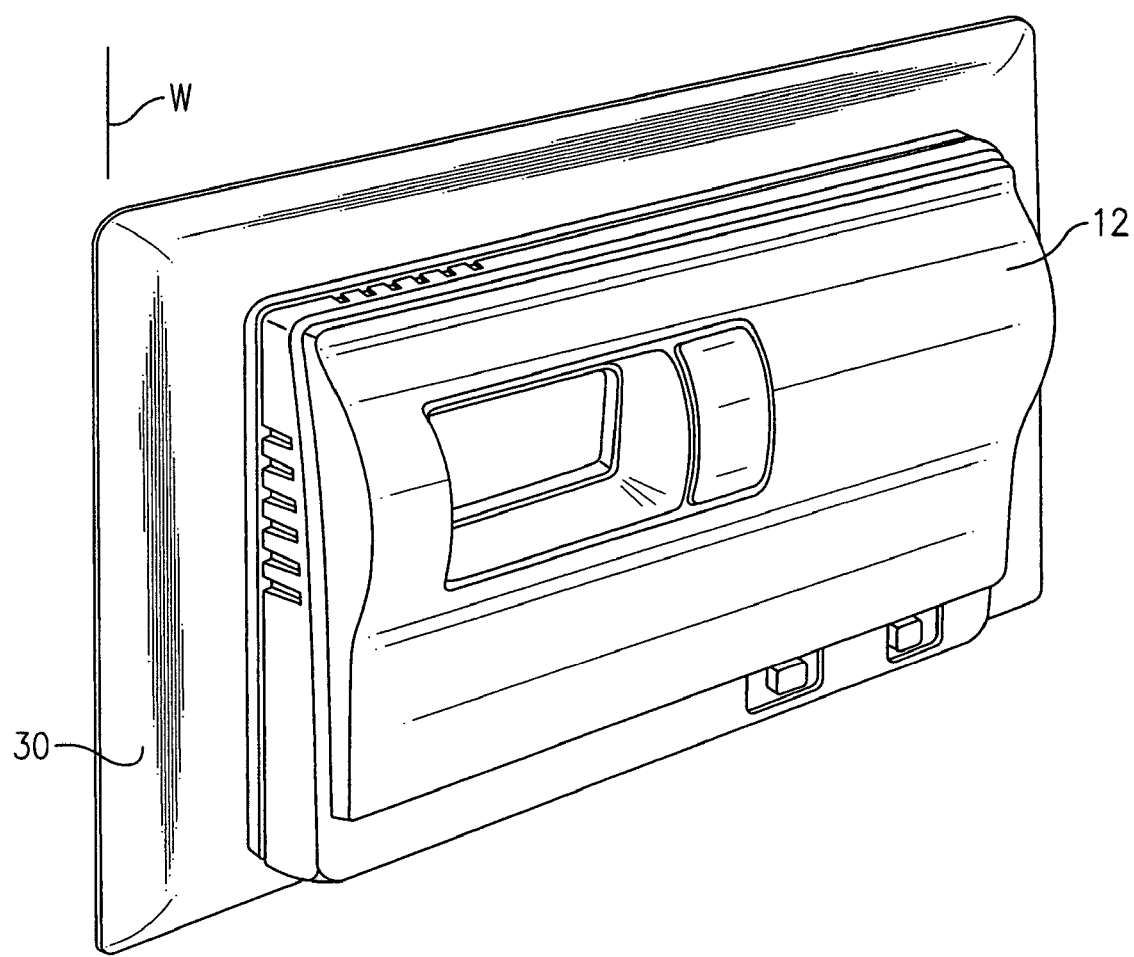
FIG. 5 is a perspective view of a wall thermostat and its associated wall plate according to this embodiment.

An embodiment of a wall plate 30 with thermal isolation is illustrated in FIGS. 3 and 4, with further reference to FIGS. 5 and 6. As shown in FIGS. 3 and 4, the wall plate 30 has on its front or proximal side a flat, rectangular central section 32 that is matched to the profile or footprint of the thermostat 12, and a surrounding tapered edge portion 34. The edge portion 34 forms a border or margin around the thermostat. There are small circular recesses 36 at each corner of the central section. As with the plate of FIG. 2, the wall plate 30 has a central wire opening 38 that lines up with the opening 20 on the back plate 14 of the thermostat 12, and slots or passages 39 for fasteners that line up with the holes 18 in the back plate of the thermostat. Now turning to FIG. 4, which shows the reverse side (i.e., distal or wall-facing side) of the wall plate 30, there is a ridge 40 that proceeds in a rectangle on the reverse side that is aligned with the central portion 32, which defines a shallow rectangular recess in which is situated a thermal barrier 42, which in this embodiment is a sheet of a closed cell resilient flexible plastic material. The thermal barrier 42 is visible in FIG. 3 through the wire opening and slots 39. There are also reinforcing ridges 44 formed on the reverse side of the tapered edge portion 34.

There is an X-shaped cut 46 at the center of the thermal barrier 40, aligned with the wire opening 38, and this is adapted to permit passage of the thermostat wires 17. The resilient material of the barrier 42 will close around the wires to seal against passage of air into the housing of the thermostat. There are also X-shaped cuts 48, 48 aligned with the slots 39 to permit passage of the threaded fasteners. In this embodiment, the sheet or barrier 42 has a nominal thickness of ⅛ inch. The foam material used as the barrier 42 can be a closed-cell urethane foam or a closed-cell polyethylene foam, which has characteristics of resilience and flexibility, and will close around the thermostat wires 17 where they pass through the X-shaped cut 46. Other plastic foam materials can be used. Also, the section of the thermal barrier 40 where the opening or cut 46 exists can be made of an insert, with the rest of the barrier made of another material.

The thermostat 12 is mounted onto the wall W with the wall plate 30 in between, as shown in FIG. 5.

The back plate 14 of the thermostat housing has a small cylindrical foot or post 50 situated at each corner, with each foot 50 extending distally, i.e., towards the wall W, and fitting into a respective one of the circular recesses 36 on the wall plate. This creates a small amount of stand-off 52, i.e., air space, between the front of the wall plate 30 and the back plate 14 of the thermostat, as shown in FIG. 6. Here, some room air circulates in the space behind the thermostat back plate 14. The combination of the insulating thermal barrier 42 and the stand-off 52 ensures that the temperature of the wall W will not affect the operation of the thermostat 12, and that the thermostat will accurately track room air temperature.

The wall plate 30 may be molded of a suitable plastic material, or may be made of any other suitable material. Also, while the thermal barrier 42 in this embodiment is a rectangular piece of a closed cell foam, in other embodiments the barrier can be made of other materials, or other shapes, so long as it is capable of both blocking air flow from the hollow wall into the interior of the thermostat and also blocking thermal contact between the wall and the thermostat.

Optionally, the grommet or plug 22 can also be used in combination with or in addition to the thermal barrier wall plate 30.

In an alternative embodiment, which could have the same front and rear appearance as shown in FIG. 5 and FIG. 4, respectively, the thermal barrier wall plate 30 could be incorporated into the back plate 14 of the thermostat, rather than being a separate element. This may be provided either with or without the stand-off air space 52.

While the invention has been described with reference to specific preferred embodiments, the invention is certainly not limited to those precise embodiments. Rather, many modifications and variations will become apparent to persons of skill in the art without departure from the scope and spirit of this invention, as defined in the appended claims.

We claim:

1. A thermostat arrangement adapted for mounting on a wall surface of a controlled space, comprising:
a thermostat having a front cover and a back plate adapted to be mounted onto said wall surface, with the back plate and the cover defining a cavity within which are contained control circuitry, and contacts which are adapted to receive two or more thermostat wires that protrude through a penetration of said wall; the back plate including fastener holes adapted for receiving attaching means to mount the thermostat on said wall surface over said penetration, and a thermostat wire opening adapted to receive said two or more thermostat wires that protrude from said penetration in said wall; and
a wall plate member adapted to be installed against the wall surface and between said wall surface and the back plate of said thermostat, the wall plate member having a small wire passage aligned with said penetration and through which said thermostat wires are passed, the wall plate member, at the location of said passage, being formed of a material capable of closing over said wires, and said wall plate member including barrier means serving as a barrier to direct air flowing out the penetration in said wall away from the cavity of said thermostat; said wall plate member further including a thermal barrier to block thermal contact between the back plate of the thermostat and said wall surface;
wherein said wall plate member includes a front rigid wall plate, and said thermal barrier includes a sheet of closed cell foam fitted onto a wall-facing side of said front rigid wall plate to contact the wall surface; and wherein said front rigid wall plate has a generally rectangular recess on its wall facing side, and said sheet of closed cell foam is fitted into said recess; wherein
said front rigid wall plate has a peripheral edge, and a ridge on the wall-facing side thereof proceeding in a generally closed rectangular shape and defining a said generally rectangular recess as a central portion within the closed rectangular shape and a margin portion between the rectangular shape and the peripheral edge; and said sheet of closed cell foam is affixed within said central portion.

2. The thermostat arrangement according to claim 1, wherein said wall plate member includes slots that are adapted to align with the positions of said fastener holes.

3. The thermostat assembly according to claim 2, wherein said sheet of closed cell foam is flexibly resilient at least at the location of said wire passage.

4. The thermostat assembly according to claim 1, wherein one or both of said thermostat back plate and said wall plate member has feet that protrude therefrom towards the other, so as to define a predetermined standoff between the thermostat back plate and said wall plate member, said standoff creating an air space between the wall plate member and the thermostat.

5. The thermostat assembly according to claim 1, wherein said thermostat back plate has a plurality of feet that protrude distally therefrom, and said wall plate member has corresponding receptacles therein to receive said feet so as to define a predetermined standoff between the thermostat back plate and a proximal surface of said wall plate member.

6. The thermostat arrangement according to claim 1, wherein said thermal barrier is incorporated into the back plate of said thermostat.

7. A thermostat arrangement according to claim 1, wherein said sheet of closed cell foam has an X-shaped cut formed of crossed slits and aligned with said small wire passage in the wall plate member.

8. A thermostat arrangement according to claim 7, wherein said sheet of closed cell foam has X-shaped cuts formed of crossed slits at positions of said fastener holes.

9. A thermostat arrangement adapted for mounting on a wall of a controlled space, comprising:
a thermostat having a front cover and a back plate adapted to be mounted on said wall, with the back plate and the cover defining a cavity within which are contained control circuitry, and contacts which are adapted to receive two or more thermostat wires that protrude through a penetration of said wall; the back plate including fastener holes adapted for receiving attaching means to mount the thermostat on said wall over said penetration, and a thermostat wire opening adapted to receive said two or more thermostat wires that protrude from said penetration in said wall; and
a wall plate member adapted to be installed between said wall and the back plate of said thermostat, the wall plate member having a small wire passage aligned with said penetration and through which said thermostat wires are passed, the wall plate member, at the location of said passage, being formed of a material capable of closing over said wires, and said wall plate member serving as a barrier to direct air flowing out the penetration in said wall away from the cavity of said thermostat; said wall plate member further including a thermal barrier to block thermal contact between the back plate of the thermostat and said wall;
wherein said wall plate member includes a front rigid wall plate. and said thermal barrier includes a sheet of closed cell foam fitted onto a wall-facing side of said front rigid wall plate; and wherein said front rigid wall plate has a generally rectangular recess on its wall facing side, and said sheet of closed cell foam is fitted into said recess, wherein said sheet of closed cell foam has a nominal thickness of 1/8 inch; and wherein
said front rigid wall plate has a peripheral edge and a ridge on the wall-facing side thereof proceeding in a generally closed shape and defining a central portion within the closed shape and a margin portion between the closed shape and the peripheral edge; and said sheet of closed cell foam is affixed within said central portion.

10. A thermostat arrangement according to claim 9, wherein said sheet of closed cell foam has an X-shaped cut formed of crossed slits and aligned with said small wire passage in the wall plate member.

11. A thermostat arrangement according to claim 10, wherein said sheet of closed cell foam has X-shaped cuts formed of crossed slits at positions of said fastener holes.

12. A thermostat arrangement adapted for mounting on a surface of a wall of a controlled space, comprising:

a thermostat having a front cover and a back plate adapted to be mounted onto the surface of said wall, with the back plate and the cover defining a cavity within which are contained control circuitry, and contacts which are adapted to receive two or more thermostat wires that protrude through a penetration of said wall; the back plate including openings adapted for receiving attaching means to mount the thermostat onto the surface of said wall over said penetration, and a thermostat wire opening adapted to receive said two or more thermostat wires that protrude from said penetration in said wall;

an intrusion air barrier positioned at the thermostat wire opening of said back plate, having a passage through which said thermostat wires are passed, said passage closing over said wires and said barrier serving to direct air flowing out the penetration in said wall away from the cavity of said thermostat; and a thermal barrier positioned between the thermostat back plate and said wall to block direct thermal contact between the thermostat and said wall;

wherein said thermostat back plate is formed of a front rigid wall plate, and said thermal barrier includes a sheet of closed cell foam fitted onto a wall-facing side of said rigid wall plate to contact the surface of said wall; and wherein said rigid wall plate has a generally rectangular recess on its wall facing side, and said sheet of closed cell foam is fitted into said recess, and wherein a portion of said thermal barrier constitutes said intrusion air barrier; and said wall plate has a peripheral edge, and a ridge on the wall-facing side thereof proceeding in a closed shape and defining a central portion within the closed shape and a margin portion between the closed shape and the peripheral edge; and said sheet of closed cell foam is affixed within said central portion.

13. A thermostat arrangement according to claim 8, further comprising means defining a stand off between the back plate of said thermostat and said intrusion air barrier and said thermal barrier, so as to create an space filled with room air behind the back plate of said thermostat.

14. A thermostat arrangement according to claim 12, wherein said sheet of closed cell foam has an X-shaped cut formed of crossed slits and aligned with said small wire passage in the wall plate member.

15. A thermostat arrangement according to claim 14, wherein said sheet of closed cell foam has X-shaped cuts formed of crossed slits at positions of said fastener holes.

* * * * *

UNITED STATES PATENT AND TRADEMARK OFFICE
CERTIFICATE OF CORRECTION

PATENT NO. : 7,617,988 B2
APPLICATION NO. : 10/887675
DATED : November 17, 2009
INVENTOR(S) : Benjamin V. Morrow et al.

It is certified that error appears in the above-identified patent and that said Letters Patent is hereby corrected as shown below:

Col. 8, Claim 13, line 20:  "according to claim 8" should read
--according to claim 12--

Signed and Sealed this

Twenty-seventh Day of April, 2010

David J. Kappos
*Director of the United States Patent and Trademark Office*